(12) United States Patent
Matsuda et al.

(10) Patent No.: US 8,558,273 B2
(45) Date of Patent: Oct. 15, 2013

(54) ENCAPSULATING SHEET FOR OPTICAL SEMICONDUCTOR

(75) Inventors: Hirokazu Matsuda, Osaka (JP); Ichiro Suehiro, Osaka (JP)

(73) Assignee: Nitto Denko Corporation, Osaka (JP)

( * ) Notice: Subject to any disclaimer, the term of this patent is extended or adjusted under 35 U.S.C. 154(b) by 71 days.

(21) Appl. No.: 13/153,903

(22) Filed: Jun. 6, 2011

(65) Prior Publication Data

US 2011/0298004 A1    Dec. 8, 2011

(30) Foreign Application Priority Data

Jun. 7, 2010 (JP) .................................. 2010-129817

(51) Int. Cl.
*H01L 33/00* (2010.01)
(52) U.S. Cl.
USPC ......... 257/100; 257/98; 257/99; 257/E33.059
(58) Field of Classification Search
USPC .......................................... 257/100, E33.059
See application file for complete search history.

(56) References Cited

U.S. PATENT DOCUMENTS

2007/0001182 A1*    1/2007    Schardt et al. ................... 257/98

FOREIGN PATENT DOCUMENTS

JP    3678673 B2    5/2005

* cited by examiner

*Primary Examiner* — Stephen W Smoot
*Assistant Examiner* — Vicki B Booker
(74) *Attorney, Agent, or Firm* — Sughrue Mion, PLLC

(57) ABSTRACT

The present invention relates to an encapsulating sheet for an optical semiconductor, including: a phosphor-containing layer containing a phosphor; and an encapsulating resin layer containing an encapsulating resin and being laminated on the phosphor-containing layer, in which, on the laminated surface therebetween, an edge of the phosphor-containing layer protrudes from an edge of the encapsulating resin layer, and a protruded length of the phosphor-containing layer is from 1 to 10 times a thickness of the encapsulating resin layer.

6 Claims, 3 Drawing Sheets

ENCAPSULATING SHEET FOR OPTICAL SEMICONDUCTOR

FIELD OF THE INVENTION

The present invention relates to an encapsulating sheet for an optical semiconductor. More particularly, the invention relates to a package for encapsulating a light emitting element such as a light emitting diode (LED) or a semiconductor laser, and relates to an encapsulating sheet for an optical semiconductor for inhibiting the resin leakage from a package at the time of molding and an optical semiconductor device encapsulated using the sheet.

BACKGROUND OF THE INVENTION

In recent years, light emitting devices of an optical semiconductor (for example, a light emitting diode or LED) are diffused in place of an incandescent lamp or a fluorescent lamp. Of light emitting devices of a white LED, a light emitting element capable of emitting blue light and a mode using a resin containing a phosphor capable of converting blue light to yellow light are the mainstream.

In general, examples of a method for fabricating a white LED include a method for coating an LED chip with a phosphor-containing resin and a method for potting a phosphor-containing resin on a cup-shaped LED device. Also, for example, in an optical semiconductor device of Patent Document 1, a phosphor cover formed by injection molding of a phosphor-containing resin is used, and it is reported that it becomes possible to dispose the phosphor thin over the whole of the outside of a package by this cover, a light extraction efficiency from a chip is enhanced, and light scattering by the phosphor is inhibited, thereby enabling one to obtain desired light directivity.

On the other hand, from the viewpoints of handling properties and throughput, a method for undergoing molding using a sheet-shaped phosphor-containing resin layer is preferable. It is preferable to use a sheet obtained by laminating an encapsulating layer and a phosphor-containing resin layer (phosphor-containing layer) and so on as such a sheet, and by undergoing molding from the top of the sheet using a metal die, it becomes possible to dispose the phosphor over the whole of the outside of the package.

Patent Document 1: Japanese Patent No. 3678673

SUMMARY OF THE INVENTION

However, even in a sheet having an encapsulating resin layer and a phosphor-containing layer laminated thereon, in the case of subjecting these layers to die molding using sheets having the same size (the same in shape and size in the bottom), on the occasion of pushing of the die, a part of the sheet (mainly the encapsulating resin layer) is broken and leaks from a package at the time of molding, so that there are encountered such problems that the appearance of the obtained package is impaired (see FIG. 1); and that it is necessary to newly provide a step of removing the leaked resin.

An object of the invention is to provide an encapsulating sheet for an optical semiconductor which is free from the occurrence of the matter that a part of the sheet leaks from the package by die molding and an optical semiconductor device encapsulated using the sheet.

In order to solve the foregoing problem, the present inventors made extensive and intensive investigations. As a result, it has been found that in a sheet in which an encapsulating resin layer is smaller by a specified size than a phosphor-containing layer, even by adopting die molding using a concave die, an optical semiconductor device exhibiting a favorable appearance is obtained without causing the resin leakage outside a package after molding, leading to accomplishment of the invention.

Namely, the present invention relates to the following items (1) to (4).

(1) An encapsulating sheet for an optical semiconductor, including:
a phosphor-containing layer containing a phosphor; and
an encapsulating resin layer containing an encapsulating resin and being laminated on the phosphor-containing layer,
in which, on the laminated surface therebetween, an edge of the phosphor-containing layer protrudes from an edge of the encapsulating resin layer, and a protruded length of the phosphor-containing layer is from 1 to 10 times a thickness of the encapsulating resin layer.

(2) An encapsulating sheet for an optical semiconductor, including:
a phosphor-containing layer containing a phosphor, and
a plurality of encapsulating resin layers containing an encapsulating resin and being laminated on plural places of the phosphor-containing layer at prescribed intervals,
in which, on the laminated surface therebetween, an edge of the phosphor-containing layer protrudes from an edge of the encapsulating resin layer, a protruded length of the phosphor-containing layer is from 1 to 10 times a thickness of the encapsulating resin layer, and a length between the adjacent encapsulating resin layers is from 2 to 10 times the thickness of the encapsulating resin layer.

(3) The encapsulating sheet for an optical semiconductor according to (1) or (2), in which a separator is further laminated on a surface of the phosphor-containing layer opposite to the encapsulating resin layer-laminated surface thereof.

(4) An optical semiconductor device obtained by disposing the encapsulating sheet for an optical semiconductor according to any one of (1) to (3) so that the encapsulating resin layer is opposite to an optical semiconductor element, followed by press molding using a concave die which has a concave structure having the same shape as in the encapsulating resin layer.

In the encapsulating sheet for an optical semiconductor according to the invention, even when used for die molding, the resin leakage from a package after molding is inhibited, so that an optical semiconductor device exhibiting a favorable appearance can be obtained.

DETAILED DESCRIPTION OF THE INVENTION

The encapsulating sheet for an optical semiconductor according to the invention is an encapsulating sheet for an optical semiconductor including a phosphor-containing layer containing a phosphor having laminated thereon an encapsulating resin layer containing an encapsulating resin, in which, on the laminated surface therebetween, an edge of the phosphor-containing layer protrudes from an edge of the encapsulating resin layer, and a protruded length of the phosphor-containing layer is from 1 to 10 times a thickness of the encapsulating resin layer. As such a sheet, the encapsulating resin layer may be laminated on the phosphor-containing layer such that the edge of the encapsulating resin layer is located inward in a length of from 1 to 10 times the thickness of the encapsulating resin layer from the edge of the phosphor-containing layer. Specific examples of such an embodiment include an embodiment in which one encapsulating resin layer is laminated at a prescribed position of the phosphor-containing layer (Embodiment 1); and an embodiment in which all of a plurality of encapsulating resin layers are laminated at prescribed positions of the phosphor-containing layer (Embodiment 2). The length (protruded length) of the edge of the phosphor-containing layer which is protruded from the edge of the encapsulating resin layer as referred to in this specification means a distance of from the edge of the encapsulating resin layer to the nearest edge of the phosphor-containing layer and is set up in all of the edges of the phosphor-containing layer.

Figure 1:
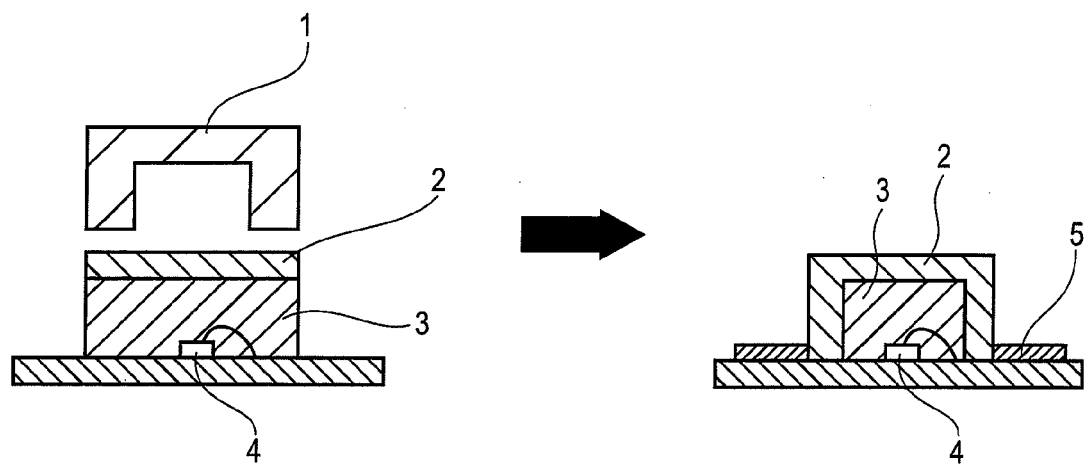
FIG. 1 is a view illustrating an example of an optical semiconductor device obtained by undergoing die molding using a sheet obtained by laminating an encapsulating resin layer and a phosphor-containing layer having the same size (the same in shape and size in the bottom), in which the left shows a state before die molding, and the right shows a state after molding.

In the case of undergoing molding using a concave die from the top of a sheet in which the encapsulating resin layer and the phosphor-containing layer each having the same size and shape in the bottom are laminated, the sheet is folded into the inside of the concave die and molded. On that occasion, a part of the sheet is broken, and the resin which has not been completely filled in the inside of the concave die (mainly the encapsulating resin) overflows, so that the resin leakage is recognized in the obtained package (see FIG. 1). Then, in the encapsulating sheet for an optical semiconductor according to the invention, the phosphor-containing layer and the encapsulating resin layer are disposed in such a manner that the edge of the phosphor-containing layer protrudes on the laminated surface therebetween from the edge of the encapsulating resin layer in a length of from 1 to 10 times the thickness of the encapsulating resin layer. Also, in the case where a plurality of encapsulating resin layers are disposed (Embodiment 2), in addition to the foregoing, the plurality of encapsulating resin layers are disposed in such a manner that a length between the adjacent encapsulating resin layers is from 2 to 10 times the thickness of the encapsulating resin layer. According to this, for example, in the case of disposing the encapsulating sheet for an optical semiconductor according to the invention in an LED device and undergoing encapsulation molding using a concave die having a concave structure having the same shape as in the encapsulating resin layer, the encapsulating resin layer is filled in the concave structure while being coated on the surface of the phosphor-containing layer without being broken. Also, in view of the fact that the protruded length of the phosphor-containing layer is not more than 10 times the thickness of the encapsulating resin layer, the use amount of the phosphor can be reduced. Thus, by using the encapsulating sheet for an optical semiconductor according to the invention, it becomes possible to provide an optical semiconductor device with an excellent appearance in high productivity.

Specifically, examples of the encapsulating sheet for an optical semiconductor according to the invention include the following embodiments.

Embodiment 1

An encapsulating sheet for an optical semiconductor, including:

a phosphor-containing layer containing a phosphor; and an encapsulating resin layer containing an encapsulating resin and being laminated on the phosphor-containing layer, in which, on the laminated surface therebetween, an edge of the phosphor-containing layer protrudes from an edge of the encapsulating resin layer, and a protruded length of the phosphor-containing layer is from 1 to 10 times a thickness of the encapsulating resin layer.

Embodiment 2

An encapsulating sheet for an optical semiconductor, including:

a phosphor-containing layer containing a phosphor, and a plurality of encapsulating resin layers containing an encapsulating resin and being laminated on plural places of the phosphor-containing layer at prescribed intervals, in which, on the laminated surface therebetween, an edge of the phosphor-containing layer protrudes from an edge of the encapsulating resin layer, a protruded length of the phosphor-containing layer is from 1 to 10 times a thickness of the encapsulating resin layer, and a length between the adjacent encapsulating resin layers is from 2 to 10 times the thickness of the encapsulating resin layer.

<Phosphor-containing Layer>

The phosphor-containing layer in each of Embodiments 1 and 2 is a resin layer containing a phosphor as described later. A resin for constituting the phosphor-containing layer is not particularly limited so far as it is a resin which has hitherto been used for encapsulating an optical semiconductor. Examples thereof include a silicone resin, an epoxy resin, a styrene resin, an acrylic resin, a polycarbonate resin, a urethane resin and a polyolefin resin. These resins may be used singly or in combinations of two or more kinds thereof. Above all, a silicone resin is preferable from the viewpoints of durability, heat resistance and light resistance.

Also, since it is preferable that the phosphor-containing layer has low elasticity such that even when an external force or a pressure at the time of encapsulation is applied, it is able to keep a fixed thickness, the silicone resin may be used upon being adjusted so as to have a crosslinking number of the siloxane skeleton according to known methods.

Such a resin may be produced according to known methods, or commercially available products may be used. Examples of a suitable commercially available product include a silicone elastomer (LR7665, manufactured by Wacker Asahikasei Silicone Co., Ltd.).

A content of the silicone resin in the resins constituting the phosphor-containing layer is 70% by weight or more, more preferably 90% by weight or more, and still more preferably substantially 100% by weight.

The phosphor in the invention is not particularly limited, and examples thereof include known phosphors that are used for optical semiconductor devices. Specifically, examples of a suitable commercially available product having a function to convert a blue color to a yellow color include a yellow phosphor ($\alpha$-sialon), YAG and TAG. Also, examples of a suitable commercially available product having a function to convert a blue color to a red color include $CaAlSiN_3$. These materials may be used singly or in combinations of two or more kinds thereof.

A blending ratio or a content of the phosphor cannot be unequivocally determined because the degree of color mixing varies depending upon the kind of the phosphor and the thickness of the phosphor-containing layer or the shape of the package.

Also, the phosphor-containing layer in the invention can contain, in addition to the foregoing, an inorganic particle, a curing agent, a curing accelerator and an additive such as an aging inhibitor, a modifier, a surfactant, a dye, a pigment, a discoloration inhibitor and an ultraviolet light absorber.

The phosphor-containing layer can be prepared according to known methods by those skilled in the art so far as the foregoing composition is obtainable. Specifically, a resin solution obtained by adding a phosphor to the foregoing constituent resin or an organic solvent solution of the resin and mixing them with stirring (the resin solution may also be called a "phosphor-containing layer constituting solution") can be molded in a sheet shape by, for example, coating the resin solution in an appropriate thickness on a release sheet whose surface has been subjected to a release treatment or a separator as described later by casting, spin coating, roll coating or the like, followed by drying upon heating at a temperature around which the solvent can be removed. Although the heating temperature cannot be unequivocally determined because it varies depending upon the kind of the resin or solvent, it is preferably from 80 to 150° C., and more preferably from 90 to 150° C. A sheet obtained by laminating a plurality of the obtained sheets and pressing them for integration by hot pressing at from 20 to 180° C. may be used as a single sheet of the phosphor-containing layer.

Although the size of the phosphor-containing layer (length of the upper side or diameter) cannot be unequivocally determined depending upon the shape and size of the encapsulating resin layer, it is necessary that after encapsulating the LED chip by the encapsulating resin layer, the phosphor-containing layer covers the encapsulating resin layer. Accordingly, from such a viewpoint, in the case of comparing the phosphor-containing layer and the encapsulating resin layer on the laminated surface, it is preferable that the phosphor-containing layer has a size to an extent that an edge of the phosphor-containing layer protrudes from an edge of the encapsulating resin layer. From the viewpoint of adhesion between the phosphor content and the substrate, a protruded length of the edge of the phosphor-containing layer is 1 or more times, and preferably 2 or more times the thickness of the encapsulating resin layer. Also, from the viewpoint of reducing the use amount of the phosphor, the protruded length is not more than 10 times, and preferably not more than 5 times the thickness of the encapsulating resin layer. Accordingly, the protruded length of the phosphor-containing layer is from 1 to 10 times, and preferably from 2 to 5 times the thickness of the encapsulating resin layer.

From the viewpoint of whitening, a thickness of the phosphor-containing layer is preferably from 30 to 200 μm, and more preferably from 70 to 120 μm.

<Encapsulating Resin Layer>

Although the encapsulating resin layers in Embodiments 1 and 2 are different in the number to be disposed on the phosphor-containing layer from each other, they have the same constitution. An encapsulating resin constituting the encapsulating resin is not particularly limited so far as it is a resin which has hitherto been used for encapsulating an optical semiconductor, and examples thereof include the same resins as those constituting the phosphor-containing layer. Above all, a silicone resin is preferable from the viewpoints of durability, heat resistance and light resistance.

Also, in view of the fact that it is preferable that the encapsulating resin exhibits a different strength depending upon the temperature such that it has low elasticity (plasticity) so as to be able to embed an element therein and is then cured to keep the shape, thereby having a characteristic endurable against an impact or the like (post-curing properties), a silicone resin or a modified silicone resin having two reaction systems may be used as the silicone resin.

Examples of the silicone resin having two reaction systems include a silicone resin having two reaction systems including a silanol condensation reaction and an epoxy reaction and a silicone resin having two reaction systems including a silanol condensation reaction and a hydrosilylation (condensation-addition curing type silicone resin).

Examples of the modified silicone resin include resins having a heterosiloxane skeleton in which a part of the Si atoms in the siloxane skeleton is substituted with an atom such as B, Al, P and Ti, such as borosiloxane, aluminosiloxane, phosphasiloxane and titanasiloxane; and resins in which an organic functional group such as a meth(acryl) group is added to the Si atom in the siloxane skeleton.

Such a resin can be produced by known production methods, and the modified silicone resin is hereunder described as an example. For example, a methacryl-modified polyaluminosiloxane can be obtained by mixing a silicone oil the both ends of which are terminated with a silanol group and aluminum isopropoxide with stirring at room temperature, adding a methacryl type silane coupling agent to the obtained oil and then mixing them with stirring.

A content of the silicone resin in the encapsulating resin constituting the encapsulating resin layer is preferably 70% by weight or more, more preferably 90% by weight or more, and still more preferably substantially 100% by weight.

Also, from the viewpoints of toughness and low linear expansion properties, the encapsulating resin layer in the invention can contain an inorganic particle. Examples of the inorganic particle include silicon dioxide (silica), barium sulfate, barium carbonate and barium titanate. These materials may be used singly or in combinations of two or more kinds thereof From the viewpoints of toughness and low linear expansion properties, a content of the inorganic particle in the encapsulating resin layer is preferably from 10 to 70% by weight, and more preferably from 40 to 60% by weight.

The encapsulating resin layer in the invention can contain, in addition to the foregoing, a curing agent, a curing accelerator and an additive such as an aging inhibitor, a modifier, a surfactant, a dye, a pigment, a discoloration inhibitor and an ultraviolet light absorber.

The encapsulating resin layer can be prepared according to known methods by those skilled in the art so far as the foregoing composition is obtainable. Although details are described later, for example, the encapsulating resin layer can be prepared by molding a mixture obtained by adding the resin constituting the encapsulating resin layer and an organic solvent solution of the resin, or if desired, the inorganic particle (the solution may also be summarized and called a "encapsulating resin layer layer constituting solution") in a desired shape, followed by drying upon heating. Although the heating temperature cannot be unequivocally determined because it varies depending upon the kind of the resin or solvent, it is preferably from 80 to 150° C., and more preferably from 90 to 150° C. The thus obtained encapsulating resin layer may also be called an "encapsulating resin layer molded article".

From the viewpoint of integration with the phosphor-containing layer, the shape of the encapsulating resin layer is not particularly limited so far as the laminated surface with the phosphor-containing layer is flat, and examples thereof include a rectangular parallelepiped, a cube, a circular cylinder, a tapered circular cylinder (the upper is smaller), and a sheet shape. A sheet obtained by laminating a plurality of sheets and pressing them for integration by hot pressing at from 20 to 180° C. is included as the sheet shape.

A size of the encapsulating resin layer (length of the side or diameter of the laminated surface with the phosphor-containing layer or an opposing surface thereto) is not particularly limited so far as it is a size to an extent that the optical semiconductor element (LED chip) can be encapsulated. From the viewpoint of undergoing encapsulation without damaging wires at the surroundings of the LED chip, or from the viewpoint of improving the angle dependency of color tint of light emission from the device, it is preferable that the encapsulating resin layer has a size to an extent that a periphery of the encapsulating resin layer protrudes from the LED chip and surrounding wires thereof (in the case of collectively encapsulating a plurality of LED chips, the outermost disposed LED chip and surrounding wires thereof). A protruded length is preferably from 1 to 20 mm, and more preferably from 1 to 5 mm.

A thickness of the encapsulating resin layer is not particularly limited so far as the LED chip can be encapsulated, and it may be larger than the thickness of the LED chip. Also, when the phosphor is present in the vicinity of the LED chip, the phosphor-containing layer extremely causes generation of heat at the time of lighting of an LED by a wavelength conversion loss or the like, and therefore, the thickness of the encapsulating layer is preferably 1 mm or more. Also, from the viewpoint of operability of the encapsulating sheet, the thickness of the encapsulating layer is preferably not more than 3 mm.

The encapsulating resin layer is corresponding to an optical semiconductor element to be encapsulated, and in the case of encapsulating a plurality of optical semiconductor elements, the optical semiconductor elements may be encapsulated collectively or individually. Accordingly, in the phosphor-containing sheet according to the invention, its embodiment varies depending upon the number of the encapsulating resin layers disposed on the phosphor-containing layer, and the case of a single encapsulating resin layer is corresponding to Embodiment 1, whereas the case of a plurality of encapsulating resin layers is corresponding to Embodiment 2. The encapsulating resin layers in Embodiment 2 individually encapsulate the optical semiconductor elements and are disposed at prescribed intervals on the phosphor-containing layer. From the viewpoint of surely encapsulating the optical semiconductor elements, a length between the adjacent encapsulating resin layers is 2 times or more, and preferably 3 times or more the thickness of the encapsulating resin layer. Also, from the viewpoint of minimizing a loss of the phosphor contained in the phosphor-containing layer, the length between the adjacent encapsulating resin layers is not more than 10 times, and preferably not more than 5 times the thickness of the encapsulating resin layer. Accordingly, the protruded length of the phosphor-containing layer is from 2 to 10 times, and preferably from 3 to 5 times the thickness of the encapsulating resin layer.

<Separator>

Also, in all of Embodiments 1 and 2, the encapsulating sheet for an optical semiconductor according to the invention may include a separator in addition to the foregoing phosphor-containing resin and encapsulating resin layer, and it is preferable that the phosphor-containing layer and the encapsulating resin layer are laminated in this order on the separator.

As the separator, any material may be used so far as it can be released from the phosphor-containing layer. Examples thereof include materials that are different at the release stage, namely the case of molding a sheet after release of the separator from the encapsulating sheet for an optical semiconductor according to the invention and the case of releasing the separator after molding the encapsulating sheet for an optical semiconductor according to the invention.

The separator which can be used in the case of molding a sheet after release of the separator is not particularly limited so far as it is able to coat and protect the surface of the phosphor-containing layer, and examples thereof include a polyester film and a polyethylene terephthalate film. Examples of a suitable commercially available product include a polyester film (a trade name: SS4C, manufactured by Nippa Corporation, thickness: 50 μm).

On the other hand, as the separator which can be used in the case of releasing the separator after sheet molding, die follow-up properties on the occasion of molding are required. Thus, examples thereof include materials which are rigid at room temperature but have a storage elastic modulus of not more than $1.0 \times 10^8$ Pa at a curing temperature, for example, 150° C. Specific examples thereof include a polystyrene film, a polypropylene film, a polycarbonate film, an acrylic film, a silicone resin film, a styrene resin film and a fluorocarbon resin film. Above all, from the viewpoints of heat resistance, release properties and follow-up properties, a polycarbonate film is preferable, and a polycarbonate film (a trade name: TR film non-oriented product, manufactured by Kaneka Corporation, thickness: 45 μm) is suitably used.

In the invention, from the viewpoint of making it easy to release the separator from the phosphor-containing layer, a separator whose surface has been subjected to a release treatment according to known methods may be used.

A thickness of the separator is not particularly limited, and in the case of making the separator follow up the die, it is preferably from 20 to 100 μm, and more preferably from 30 to 50 μm.

A method for preparing the encapsulating sheet for an optical semiconductor according to the invention is not particularly limited so far as the encapsulating sheet for an optical semiconductor contains the phosphor-containing layer and the encapsulating resin layer, and the encapsulating resin layer(s) is disposed at a specified position(s) on the phosphor-containing layer. Also, as an embodiment of producing the encapsulating sheet for an optical semiconductor in each of Embodiments 1 and 2, which is, however, different in the number of the encapsulating resin layer, the following Embodiments A and B are exemplified. In the case of preparing the encapsulating sheet for an optical semiconductor according to Embodiment 2, a screen having a hole in the number corresponding to the encapsulating resin layers may be used in Embodiment A; and encapsulating resin layer molded articles in the number of the encapsulating resin layers may be prepared in Embodiment B.

Embodiment A

An embodiment in which a screen having a hole is disposed on a phosphor-containing layer laminated on a separator; an encapsulating resin layer constituting solution is filled in the hole; after smoothening the surface, the resultant solution is dried upon heating; and the screen is then released to prepare an encapsulating sheet for an optical semiconductor.

Embodiment B

An embodiment in which a screen having a hole is disposed on a separator; an encapsulating resin layer constituting solution is filled in the hole; after smoothening the surface, the resultant solution is dried upon heating; the screen is released to prepare encapsulating resin layer molded articles; and the encapsulating resin layer molded articles are disposed on a separately-prepared laminate of a separator and a phosphor-containing layer on the phosphor-containing layer-side, followed by hot pressing to prepare an encapsulating sheet for an optical semiconductor.

Figure 2:
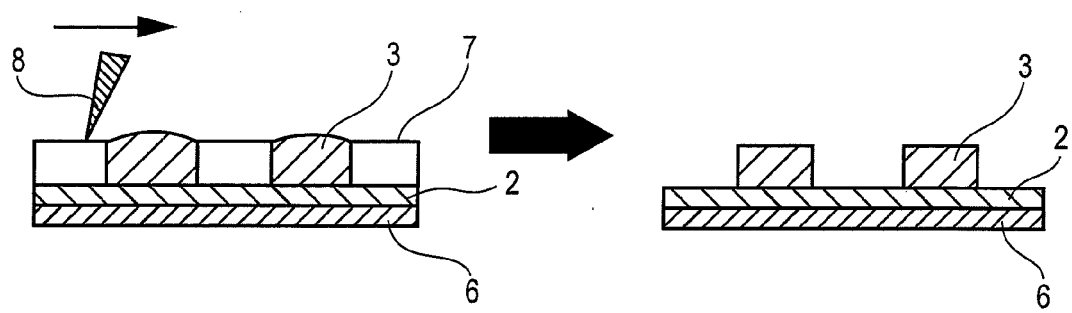
FIG. 2 is a view illustrating an embodiment of a method for preparing an encapsulating sheet for an optical semiconductor according to the invention, in which the left shows a state where an encapsulating resin layer constituting solution is filled, and the right shows a state after molding.

An example of Embodiment A is illustrated in FIG. 2. In view of the fact that Embodiment A is an embodiment in which the encapsulating resin layer is formed directly on the phosphor-containing layer, the preparation method of Embodiment A is also called a "direct forming method".

In the left of FIG. 2, the laminate of the separator and the phosphor-containing layer can be, for example, prepared in a method in which at molding the phosphor-containing layer in a sheet shape, the phosphor-containing layer is molded directly on the separator. Also, the laminate of the separator and the phosphor-containing layer may be prepared by laminating a phosphor-containing layer which is separately prepared in a sheet shape on the separator, followed by laminating or hot pressing.

Although the hole of the screen is particularly limited, in view of the fact that the encapsulating resin layer having the same shape as that of the hole of the screen is obtainable, it is preferable to set up the size and thickness of the hole so as to have a size such that the encapsulating resin layer is able to encapsulate the LED chip and surrounding wires thereof without damaging them.

Filling of the encapsulating resin layer constituting solution in the hole of the screen, and for example, filling can be performed according to known methods such as screen printing.

By subjecting the encapsulating resin layer constituting solution filled in the hole of the screen to a smoothening treatment or the like such that its surface is made flat using a spatula or the like and then drying upon heating at preferably from 80 to 150° C., and preferably from 90 to 150° C., preparation of the encapsulating resin layer molded article and laminating of the encapsulating resin layer onto the phosphor-containing layer can be performed at the same time. It is preferable to perform release of the screen after the encapsulating resin layer molded article is thoroughly cured to reach a state where it is possible to achieve a handling operation.

Figure 3:
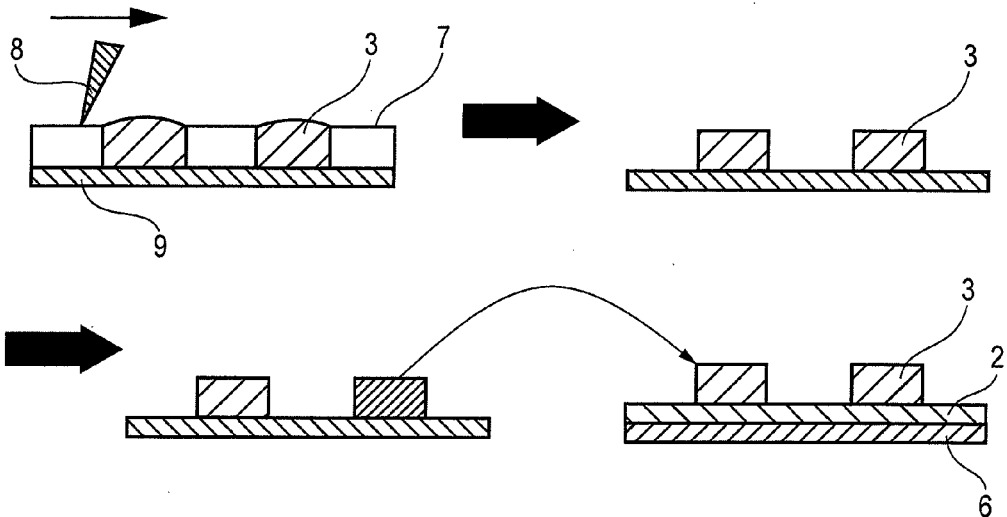
FIG. 3 is a view illustrating an embodiment of a method for preparing an encapsulating sheet for an optical semiconductor according to the invention, in which the upper left shows a state where an encapsulating resin layer constituting solution is filled; the upper right shows a state of the encapsulating resin layer after molding; the lower shows a state where a molded article of the encapsulating resin layer is disposed on a separately-prepared phosphor-containing layer.

An example of Embodiment B is illustrated in FIG. 3. In Embodiment B, in view of the fact that a separately prepared encapsulating resin layer is stuck to the phosphor-containing layer, the preparation method of Embodiment B is also called an "indirect forming method".

The upper of FIG. 3 shows the preparation of the encapsulating resin layer molded article. According to Embodiment B, the encapsulating resin layer molded article can be prepared in the same manner as in Embodiment A, except that in Embodiment A, a separately-prepared separator for preparing an encapsulating resin layer molded article is disposed on, for example, a release sheet (for example, a polyester film) whose surface has been subjected to a release treatment instead of disposing the screen on the laminate of the separator and the phosphor-containing layer.

The lower of FIG. 3 shows the integration of the encapsulating resin and the phosphor-containing layer. Specifically, by releasing the encapsulating layer molded article as prepared above from the separator for preparing an encapsulating resin layer molded article and then disposing it on the phosphor-containing layer of the laminate of the separator and the phosphor-containing layer as prepared in the same manner as in Embodiment A, followed by hot pressing, the encapsulating layer and the phosphor-containing layer can be integrated. In the case of preparing the encapsulating sheet for an optical conductor of Embodiment 2, after a plurality of encapsulating resin layers are disposed at fixed intervals on the phosphor-containing layer, hot pressing may be performed.

Thus, the encapsulating sheet for an optical semiconductor according to the invention including an encapsulating resin layer and a phosphor-containing layer is obtained.

Although a use embodiment of the encapsulating sheet for an optical semiconductor according to the invention is not particularly limited, in the case where the encapsulating sheet for an optical semiconductor according to the invention includes a separator, the following embodiments are exemplified.

Embodiment a

An embodiment in which the encapsulating sheet for an optical semiconductor according to the invention is disposed on a planar substrate having one LED chip mounted thereon in such a manner that the encapsulating resin layer is opposite to the LED chip; a concave die is pressed in a state where the separator is provided as it stands; and after press molding, the concave die and the separator are successively released.

Embodiment b

An embodiment in which the encapsulating sheet for an optical semiconductor according to the invention is disposed on a planar substrate having one LED chip mounted thereon in such a manner that the encapsulating resin layer is opposite to the LED chip; after releasing the separator, a concave die is pressed; and after press molding, the concave die is released.

Embodiment c

An embodiment in which the encapsulating sheet for an optical semiconductor according to the invention is disposed on a planar substrate having a plurality of LED chips mounted thereon in such a manner that the encapsulating resin layer is opposite to the LED chip for every LED chip; a concave die is pressed in a state where the separator is provided as it stands; and after press molding, the concave die and the separator are successively released.

Embodiment d

An embodiment in which the encapsulating sheet for an optical semiconductor according to the invention is disposed on a planar substrate having a plurality of LED chips mounted thereon in such a manner that the encapsulating resin layer is opposite to the LED chip for every LED chip; after releasing the separator, a concave die is pressed; and after press molding, the concave die is released.

Embodiment e

An embodiment in which the encapsulating sheet for an optical semiconductor according to the invention is disposed on a planar substrate having a plurality of LED chips mounted thereon in such a manner that the encapsulating resin layer covers all of the LED chips; a concave die is pressed in a state where the separator is provided as it stands; and after press molding, the concave die and the separator are successively released.

Embodiment f

An embodiment in which the encapsulating sheet for an optical semiconductor according to the invention is disposed on a planar substrate having a plurality of LED chips mounted thereon in such a manner that the encapsulating resin layer covers all of the LED chips; after releasing the separator, a concave die is pressed; and after press molding, the concave die is released.

Of these embodiments, representative embodiments are described by reference to FIGS. 4 to 6.

Figure 4:
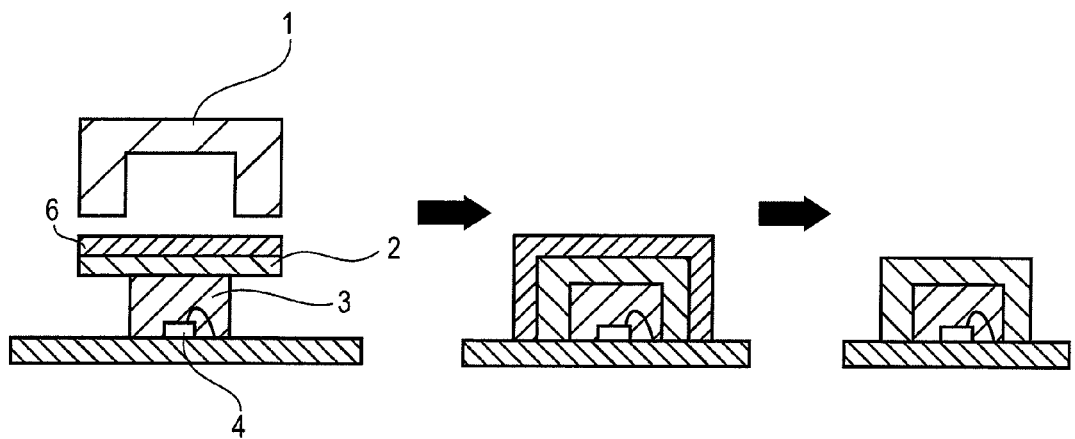
FIG. 4 is a view illustrating an embodiment of encapsulating one LED chip using an encapsulating sheet for an optical semiconductor according to the invention, in which the left shows a state where the encapsulating sheet for an optical semiconductor according to the invention is disposed on an LED chip; the center shows a state of undergoing encapsulation using a concave die; and the right shows a state where the concave die and a separator are released, respectively.

As an example of Embodiment a, FIG. 4 illustrates an embodiment in which one LED chip is encapsulated using the encapsulating sheet for an optical semiconductor according to the invention including a separator. The encapsulating sheet for an optical semiconductor which is suitably used in such an embodiment is the sheet of Embodiment 1.

The left of FIG. 4 shows a state where the encapsulating sheet for an optical semiconductor according to the invention is disposed in a state where the separator is provided as it stands, on a planar substrate having one LED chip mounted thereon in such a manner that the encapsulating resin layer is opposite to the LED chip, while allowing a center of the bottom of the encapsulating resin layer to conform to a center of the upper surface of the LED chip.

The center of FIG. 4 shows a state where the concave die having a size corresponding to the LED chip is disposed so as to allow a center of the bottom of the die to conform to that of the upper surface of the LED chip and pressed, thereby undergoing press molding. The concave die as used herein is not particularly limited so far as the LED chip and surrounding wires thereof are encapsulated by the encapsulating resin layer. From the viewpoint of inhibiting the resin leakage of the encapsulating resin by press molding, it is preferable that the concave die is a die having a concave shape of the same size as in the encapsulating resin layer molded article.

The right of FIG. 4 shows a state where after press molding, the molded article is allowed to stand until even when placed at room temperature, the shape of the encapsulating resin layer does not change, and the concave die is then released, following by releasing the separator.

Figure 5:
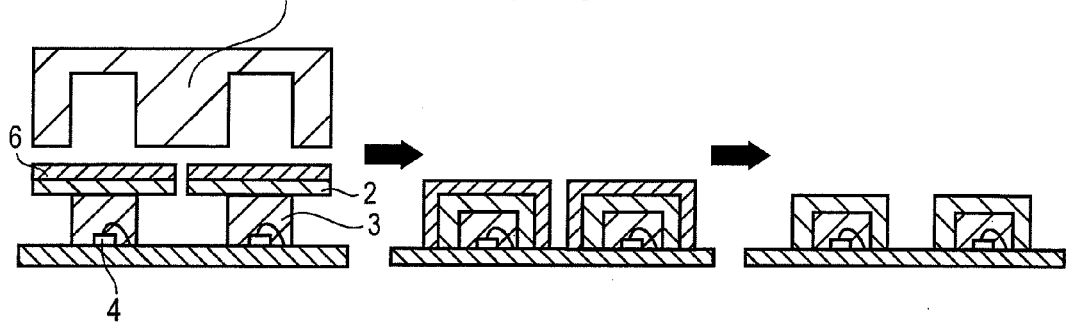
FIG. 5 is a view illustrating an embodiment of individually encapsulating a plurality of LED chips using an encapsulating sheet for an optical semiconductor according to the invention, in which the left shows a state where the encapsulating sheet for an optical semiconductor according to the invention is disposed on the LED chips; the center shows a state of undergoing encapsulation using a concave die; and the right shows a state where the concave die and a separator are released, respectively.

As an example of Embodiment c, FIG. 5 illustrates an embodiment in which a plurality of LED chips are encapsulated using the encapsulating sheet for an optical semiconductor according to the invention including a separator. In this embodiment, the encapsulating sheets for an optical semiconductor of Embodiment 1 of the same number as that of LED chips to be encapsulated may be used, or the encapsulating sheet for an optical semiconductor of Embodiment 2 including the encapsulating resin layers having the same number as that of LED chips to be encapsulated may be used.

The left of FIG. 5 shows a state where the encapsulating sheet for an optical semiconductor according to the invention is disposed in a state where the separator is provided as it stands, on a planar substrate having a plurality of LED chips mounted thereon in such a manner that the encapsulating resin layer is opposite to each of the LED chips, while allowing a center of the bottom of the encapsulating resin layer to conform to a center of the upper surface of each of the LED chips.

The center of FIG. 5 shows a state where a comb-toothed concave die capable of individually encapsulating the LED chips and collectively encapsulating them is pressed while allowing a center of the bottom of the concave structure of the die to conform to a center of the upper surface of each of the LED chips, thereby undergoing press molding. The comb-toothed concave die as used herein is not particularly limited so far as it is possible to encapsulate the LED chip and surrounding wires thereof by the encapsulating resin layer for every LED chip and to undergo the encapsulation collectively. From the viewpoint of inhibiting the resin leakage of the encapsulating resin by press molding, it is preferable that each of the concave structures of the comb has the same size as in the encapsulating resin layer.

The right of FIG. 5 shows a state where after press molding, the molded article is allowed to stand until even when placed at room temperature, the shape of the encapsulating resin layer does not change, and the concave die is then released, following by releasing the separator.

Figure 6:
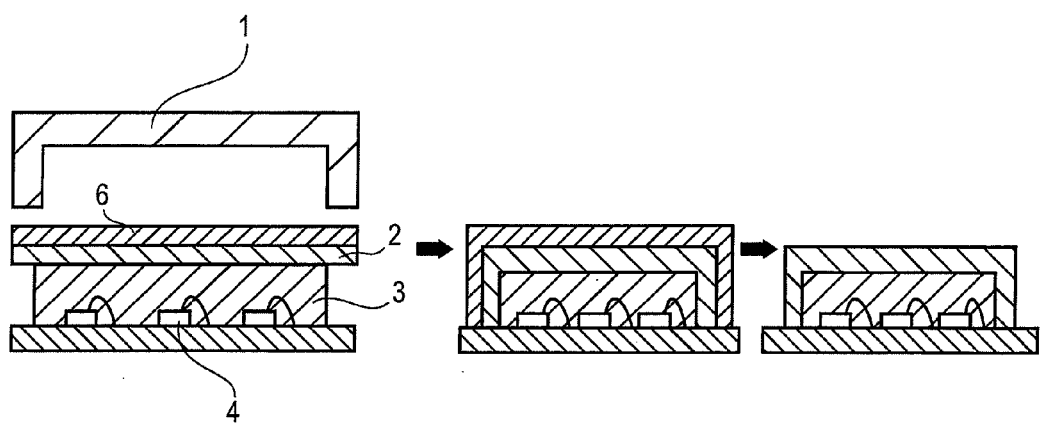
FIG. 6 is a view illustrating an embodiment of collectively encapsulating a plurality of LED chips using an encapsulating sheet for an optical semiconductor according to the invention, in which the left shows a state where the encapsulating sheet for an optical semiconductor according to the invention is disposed on the LED chips; the center shows a state of undergoing encapsulation using a concave die; and the right shows a state where the concave die and a separator are released, respectively.

As an example of Embodiment e, FIG. 6 illustrates an embodiment in which plural LED chips are collectively encapsulated by the same encapsulating resin layer using the encapsulating sheet for an optical semiconductor according to the invention including a separator. The encapsulating sheet for an optical semiconductor according to the invention as used in this embodiment is one piece of the encapsulating sheet for an optical semiconductor of Embodiment 1 regardless of the number of LED chips.

The left of FIG. 6 shows a state where the encapsulating sheet for an optical semiconductor according to the invention is disposed on a planar substrate having a plurality of LED chips mounted thereon in such a manner that the encapsulating resin layer covers all of the LED chips.

The center of FIG. 6 shows a state where a concave die having a size such that all of the LED chips can be encapsulated by one encapsulating resin layer is pressed, followed by undergoing press molding. The concave die as used herein is not particularly limited so far as all of the LED chips and surrounding wires thereof are encapsulated by the same encapsulating resin layer. From the view point of inhibiting the resin leakage of the encapsulating resin layer by press molding, it is preferable that the concave die is a die having a concave shape of the same size as in the encapsulating resin layer molded article.

The right of FIG. 6 shows a state where after press molding, the molded article is allowed to stand until even when placed at room temperature, the shape of the encapsulating resin layer does not change, and the concave die is then released, following by releasing the separator.

In all of the embodiments, the molding condition using the concave die is not particularly limited. A heating temperature is preferably from 120 to 200° C., and more preferably from 140 to 180° C. A heating time is preferably from 0.5 to 30 minutes, and more preferably from 1 to 10 minutes. Also, from the viewpoint of preventing the incorporation of air bubbles into the encapsulating resin layer from occurring, molding may be performed under reduced pressure.

After press molding, before releasing the concave die and the separator, post-curing may be performed upon heating under pressure for a time necessary for curing of the encapsulating resin layer.

Also, in the invention, on the occasion of disposing the encapsulating sheet for an optical semiconductor according to the invention on an LED chip, from the viewpoint of preventing breakage of wires in the surroundings of the LED chip to be caused due to an external force or a pressure at the time of molding from occurring, the LED chip and surrounding wires thereof may be protected by previously dropping a protecting resin (also called as a "potting resin") thereon and drying it upon heating.

The potting resin is not particularly limited so far as it is a resin which has hitherto been used for encapsulating an optical semiconductor. Examples thereof include translucent resins such as a silicone resin, an epoxy resin, a styrene resin, an acrylic resin, a polycarbonate resin, a urethane resin and a polyolefin resin. These resins may be used singly or in combinations of two or more kinds thereof. Above all, a silicone resin is preferable from the viewpoints of durability, heat resistance and light resistance.

Also, from the viewpoints of toughness and low linear expansion properties, the potting resin can contain, as an additive, an inorganic particle such as silicon dioxide (silica), barium sulfate, barium carbonate and barium titanate. These materials may be used singly or in combinations of two or more kinds thereof. A content of the inorganic particle is preferably from 10 to 70% by weight in the potting resin.

A use amount of the potting resin is not particularly limited so far as the LED chip and surrounding wires thereof can be covered. From the viewpoint that the shape after the encapsulation using the encapsulating sheet for an optical semiconductor according to the invention is favorable, the use amount of the potting resin is preferably from 2 to 20 mg, and more preferably from 3 to 10 mg per LED chip having a size of 1 mm×1 mm.

Thus, it becomes possible to encapsulate LED chips in various forms using the encapsulating sheet for an optical semiconductor according to the invention. Accordingly, the invention provides an optical semiconductor device encapsulated by the encapsulating sheet for an optical semiconductor according to the invention.

In the optical semiconductor device according to the invention, the optical semiconductor element is encapsulated simply and easily using the encapsulating sheet for an optical semiconductor according to the invention. Since the resin leakage at the time of press molding is inhibited using the encapsulating sheet for an optical semiconductor according to the invention, the package after molding exhibits a favorable appearance and can be suitably used. Also, a removal process of a portion of the resin leakage is not necessary, resulting in an enhancement of throughput.

EXAMPLES

The invention is hereunder described on the basis of the following Examples and Comparative Examples, but it should not be construed that the invention is limited to these Examples and so on.

Preparation Example 1 of Encapsulating Resin Layer (Encapsulating Resin Layer Constituting Solution)

600 g (0.200 moles) of a dual-end silanol type silicone oil (a trade name: KF-970, manufactured by Shin-Etsu Chemical Co., Ltd., average molecular weight: 3,000) and 8.22 g (40.2 moles) of aluminum isopropoxide were mixed with stirring at room temperature (25° C.) for 24 hours. Thereafter, the obtained mixture was centrifuged to remove impurities, and the residue was concentrated under reduced pressure at 50° C. for 2 hours, thereby obtaining a polyaluminosiloxane oil. 10 parts by weight of a methacryl type silane coupling agent (KBM-503, manufactured by Shin-Etsu Chemical Co., Ltd.) was added to 100 parts by weight of the obtained polyaluminosiloxane oil, and the mixture was stirred under reduced pressure at 80° C. for 10 minutes, thereby obtaining a methacryl-modified polyaluminosiloxane (encapsulating resin layer constituting solution A that is a silica-free resin solution).

Preparation Example 2 of Encapsulating Resin Layer (Encapsulating Resin Layer Constituting Solution)

To the methacryl-modified polyaluminosiloxane obtained in Preparation Example 1 of Encapsulating Resin Layer (encapsulating resin layer constituting solution), a silica fine particle was added and mixed in an amount of 50% by weight, thereby obtaining a silica-containing methacryl-modified polyaluminosiloxane (encapsulating resin layer constituting solution B that is a silica-containing resin solution).

Preparation Example 1 of Phosphor-Containing Layer

To a silicone elastomer (a trade name: LR7665, manufactured by Wacker Asahikasei Silicone Co., Ltd., that is a dimethylsiloxane skeleton derivative) solution, a yellow phosphor ($\alpha$-sialon) was added in a particle concentration of 40% by weight, and the mixture was stirred for one hour. The obtained solution was coated in a thickness of 100 μm on a polyester film (a trade name: SS4 C, manufactured by Nippa Corporation, thickness: 50 μm) and then dried at 100° C. for 10 minutes, thereby obtaining a phosphor-containing layer (polyester film-integrated phosphor-containing layer) laminated on a separator.

Preparation Example 2 of Phosphor-Containing Layer

A phosphor-containing layer (polycarbonate film-integrated phosphor-containing layer) laminated on a separator was obtained in the same manner as in Preparation Example 1 of Phosphor-Containing Layer, except for changing the separator to a polycarbonate film (a trade name: TR film non-oriented product, manufactured by Kaneka Corporation, thickness: 45 μm).

Example 1

(Encapsulating Sheet for an Optical Semiconductor)

An SUS plate (thickness: 1 mm) having a hole of a size of 8 mm×8 mm was disposed on the polycarbonate film-integrated phosphor-containing layer, the encapsulating resin layer constituting solution A was filled in the hole part, and the surface was smoothened with a rubber spatula. Thereafter, drying was performed at 100° C. for 10 minutes in a state where the SUS plate was disposed, and the SUS plate was then removed, thereby obtaining a molded article having an encapsulating resin layer of a rectangular parallelepiped (size: 8 mm×8 mm, height: 1 mm) laminated on the phosphor-containing layer. The obtained molded article was cut into a size of 10 mm×10 mm in terms of the polycarbonate film-integrated phosphor-containing layer of the bottom, while allowing a center of the bottom of the encapsulating resin layer to conform to a center of the bottom of the phosphor-containing layer, thereby obtaining an encapsulating sheet for an optical semiconductor.
(Optical Semiconductor Device)

The obtained encapsulating sheet for an optical semiconductor was disposed on a substrate having one LED chip mounted thereon in such a manner that the encapsulating resin layer was opposite to the LED chip, while allowing a center of the encapsulating resin layer to conform to a center of the top of the LED chip, followed by molding under a condition at 160° C. under 0.1 MPa for 5 minutes using a concave SUS die having a concave shape having a depth of 1 mm and a size of 8 mm×8 mm. Thereafter, the molded article was allowed to stand until even when placed at room temperature, the shape of the encapsulating resin layer did not change, and the concave die and the separator were then successively released, thereby producing an optical semiconductor device.

Example 2

(Encapsulating Sheet for an Optical Semiconductor)

An encapsulating sheet for an optical semiconductor was prepared in the same manner as in Example 1, except for using the polyester film-integrated phosphor-containing layer in place of the polycarbonate film-integrated phosphor-containing layer.
(Optical Semiconductor Device)

The obtained encapsulating sheet for an optical semiconductor was disposed on a substrate having one LED chip mounted thereon in such a manner that the encapsulating resin layer was opposite to the LED chip, while allowing a center of the encapsulating resin layer to conform to a center of the top of the LED chip, and after releasing the separator, the resultant was subjected to a molding treatment under the same condition as in Example 1. Thereafter, the molded article was allowed to stand until even when placed at room temperature, the shape of the encapsulating resin layer did not change, and the concave die was then released, thereby producing an optical semiconductor device.

Example 3

(Optical Semiconductor Device)

Figure 7:
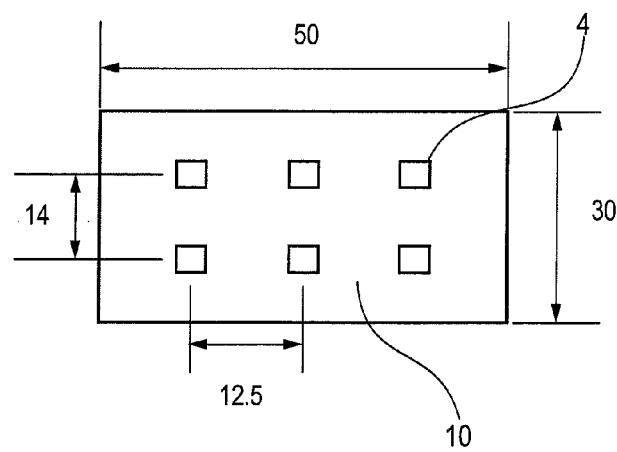
FIG. 7 is a view showing an alignment state of six LED chips to be encapsulated using an encapsulating sheet for an optical semiconductor according to the invention in Examples 3, 5 and 6, in which all units of lengths shown therein are "mm".

Each of six pieces of the same encapsulating sheet for an optical semiconductor as in Example 1 was disposed on a substrate having six LED chips mounted thereon (see FIG. 7) in such a manner that the encapsulating resin layer was opposite to each of the LED chips, while allowing a center of the encapsulating resin layer to conform to a center of the top of each of the LED chips, followed by molding under the same condition as in Example 1 using a concave SUS die having six concave shapes each having a depth of 1 mm and a size of 8 mm×8 mm. Thereafter, the molded article was allowed to stand until even when placed at room temperature, the shape of the encapsulating resin layer did not change, and the concave die and the separator were then successively released, thereby producing an optical semiconductor device.

Example 4

(Optical Semiconductor Device)

Each of six pieces of the same encapsulating sheet for an optical semiconductor as in Example 2 was disposed on each LED chip of the same substrate as in Example 3, and after releasing the separator, the resultant was subjected to a molding treatment using the same die as in Example 3. Thereafter, the molded article was allowed to stand until even when placed at room temperature, the shape of the encapsulating resin layer did not change, and the concave die was then released, thereby producing an optical semiconductor device.

Example 5

(Encapsulating Sheet for an Optical Semiconductor)

An SUS plate (thickness: 1 mm) having a hole of a size of 20 mm×31 mm was disposed on the polycarbonate film-integrated phosphor-containing layer, the encapsulating resin layer constituting solution A was filled in the hole part, and the surface was smoothened with a rubber spatula. Thereafter, drying was performed at 100° C. for 10 minutes in a state where the SUS plate was disposed, and the SUS plate was then removed, thereby obtaining a molded article having an encapsulating resin layer of a rectangular parallelepiped (size: 20 mm×31 mm, height: 1 mm) laminated on the phosphor-containing layer. The obtained molded article was cut into a size of 22 mm×33 mm in terms of the polycarbonate film-integrated phosphor-containing layer of the bottom, while allowing a center of the bottom of the encapsulating resin layer to conform to a center of the bottom of the phosphor-containing layer, thereby obtaining an encapsulating sheet for an optical semiconductor.
(Optical Semiconductor Device)

The obtained encapsulating sheet for an optical semiconductor was disposed on the same substrate as in Example 3 in such a manner that the encapsulating resin layer covered all of the six LED chips, and the resultant was subjected to a molding treatment under the same condition as in Example 1 using a concave SUS die having a concave shape having a depth of 1 mm and a size of 20 mm×31 mm. Thereafter, the molded article was allowed to stand until even when placed at room temperature, the shape of the encapsulating resin layer did not change, and the concave die and the separator were then successively released, thereby producing an optical semiconductor device.

Example 6

(Encapsulating Sheet for an Optical Semiconductor)

An encapsulating sheet for an optical semiconductor was prepared in the same manner as in Example 5, except for using the polyester film-integrated phosphor-containing layer in place of the polycarbonate film-integrated phosphor-containing layer.
(Optical Semiconductor Device)

The obtained encapsulating sheet for an optical semiconductor was disposed on the LED chips on the same substrate as in Example 3, and after releasing the separator, the resultant was subjected to a molding treatment using the same die as in Example 5. Thereafter, the molded article was allowed to stand until even when placed at room temperature, the shape of the encapsulating resin layer did not change, and the concave die was then released, thereby producing an optical semiconductor device.

Example 7

(Encapsulating Sheet for an Optical Semiconductor)

An SUS plate (thickness: 1 mm) having a hole of a size of 8 mmφ was disposed on the polycarbonate film-integrated phosphor-containing layer, the encapsulating resin layer constituting solution A was filled in the hole part, and the surface was smoothened with a rubber spatula. Thereafter, drying was performed at 100° C. for 10 minutes in a state where the SUS plate was disposed, and the SUS plate was then removed, thereby obtaining a molded article having an encapsulating resin layer of a circular cylinder (size: 8 mmφ, height: 1 mm) laminated on the phosphor-containing layer. The obtained molded article was cut into a size of 10 mmφ in terms of the polycarbonate film-integrated phosphor-containing layer of the bottom, while allowing a center of the bottom of the encapsulating resin layer to conform to a center of the bottom of the phosphor-containing layer, thereby obtaining an encapsulating sheet for an optical semiconductor.

(Optical Semiconductor Device)

The obtained encapsulating sheet for an optical semiconductor was disposed on a substrate having one LED chip mounted thereon in such a manner that the encapsulating resin layer was opposite to the LED chip, while allowing a center of the encapsulating resin layer to conform to a center of the top of the LED chip, and the resultant was molded under the same condition as in Example 1 using a concave SUS die having a concave shape having a depth of 1 mm and a size of 8 mmφ. Thereafter, the molded article was allowed to stand until even when placed at room temperature, the shape of the encapsulating resin layer did not change, and the concave die and the separator were then successively released, thereby producing an optical semiconductor device.

Example 8

(Encapsulating Sheet for an Optical Semiconductor)

An SUS plate (thickness: 1 mm) having a hole of a size of 8 mm×8 mm was disposed on a polyester film (a trade name: SS4C, manufactured by Nippa Corporation, thickness: 50 μm), the encapsulating resin layer constituting solution A was filled in the hole part, and the surface was smoothened with a rubber spatula. Thereafter, drying was performed at 100° C. for 10 minutes in a state where the SUS plate was disposed, and the SUS plate was then removed, thereby obtaining an encapsulating resin layer molded article of a rectangular parallelepiped. Subsequently, the polycarbonate film-integrated phosphor-containing layer was cut into a size of 10 mm×10 mm, on which was then disposed the foregoing molded article, while allowing a center of the bottom of the encapsulating resin layer to conform to a center of the bottom of the phosphor-containing layer, followed by hot pressing to obtain an encapsulating sheet for an optical semiconductor.

(Optical Semiconductor Device)

An optical semiconductor device was produced in the same manner as in Example 1, except for using the above-obtained encapsulating sheet for an optical semiconductor.

Example 9

An encapsulating sheet for an optical semiconductor was prepared in the same manner as in Example 1, except that in Example 1, the polycarbonate film-integrated phosphor-containing layer was cut into a size of 12 mm×12 mm, and thereafter, an optical semiconductor device was produced in the same manner as in Example 1, except for using the obtained sheet.

Example 10

On a substrate having one LED chip mounted thereon, 3 mg of a silicone resin having 50% by weight of silica blended therein was dropped as a potting resin on the LED chip and surrounding wires thereof, followed by drying upon heating at 180° C. for 10 minutes to protect them. Thereafter, the same encapsulating sheet for an optical semiconductor as in Example 1 was disposed in such a manner that the encapsulating resin layer was opposite to the LED chip (LED chip protected by the potting resin), thereby producing an optical semiconductor device in the same manner as in Example 1.

Example 11

An encapsulating sheet for an optical semiconductor was prepared in the same manner as in Example 1, except that in Example 1, the encapsulating resin layer constituting solution B (containing silica) was used as a resin for filling the hole part in place of the encapsulating resin layer constituting solution A (silica-free), and thereafter, an optical semiconductor device was produced in the same manner as in Example 1, except for using the obtained sheet.

Example 12

An optical semiconductor device was produced in the same manner as in Example 10, except for using the same encapsulating sheet for an optical semiconductor as in Example 11.

Comparative Example 1

(Encapsulating Sheet for an Optical Semiconductor)

The encapsulating resin layer constituting solution A was coated in a thickness of 1 mm on the polycarbonate film-integrated phosphor-containing layer, followed by drying at 100° C. for 10 minutes. The obtained sheet was cut into a size of 10 mm×10 mm, thereby obtaining an encapsulating sheet for an optical semiconductor.

(Optical Semiconductor Device)

An optical semiconductor device was produced in the same manner as in Example 1, except for using the above-obtained encapsulating sheet for an optical semiconductor.

Comparative Example 2

An encapsulating sheet for an optical semiconductor was prepared in the same manner as in Example 1, except that in Example 1, the polycarbonate film-integrated phosphor-containing layer was cut into a size of 8 mm×8 mm and used, and thereafter, an optical semiconductor device was produced in the same manner as in Example 1, except for using the obtained sheet.

With respect to the obtained optical semiconductor devices, characteristics were evaluated according to the following Test Example 1. The results are shown in Table 1.

Test Example 1 (Appearance)

In each of the optical semiconductor devices after molding, whether or not the resin leakage was confirmed was visually observed. The case where the resin leakage was confirmed is defined as "Observed", and the case where the resin leakage was not confirmed is defined as "Not Observed".

TABLE 1

Encapsulating sheet for an optical semiconductor

| | Separator Kind | Phosphor-containing layer Shape (mm) | Encapsulating resin layer Kind | Encapsulating resin layer Bottom shape (mm) | Encapsulating resin layer Thickness (mm) | Protrusion ratio of phosphor-containing layer (times) | Forming method |
|---|---|---|---|---|---|---|---|
| Example 1 | Polycarbonate | 10 × 10 | Silica-free | 8 × 8 | 1 | 1 | Direct forming |
| Example 2 | Polyester | 10 × 10 | Silica-free | 8 × 8 | 1 | 1 | Direct forming |
| Example 3 | Polycarbonate | 10 × 10 | Silica-free | 8 × 8 | 1 | 1 | Direct forming |
| Example 4 | Polyester | 10 × 10 | Silica-free | 8 × 8 | 1 | 1 | Direct forming |
| Example 5 | Polycarbonate | 22 × 33 | Silica-free | 20 × 31 | 1 | 1 | Direct forming |
| Example 6 | Polyester | 22 × 33 | Silica-free | 20 × 31 | 1 | 1 | Direct forming |
| Example 7 | Polycarbonate | 10φ | Silica-free | 8φ | 1 | 1 | Direct forming |
| Example 8 | Polycarbonate | 10 × 10 | Silica-free | 8 × 8 | 1 | 1 | Indirect forming |
| Example 9 | Polycarbonate | 12 × 12 | Silica-free | 8 × 8 | 1 | 2 | Direct forming |
| Example 10 | Polycarbonate | 10 × 10 | Silica-free | 8 × 8 | 1 | 1 | Direct forming |
| Example 11 | Polycarbonate | 10 × 10 | Containing silica | 8 × 8 | 1 | 1 | Direct forming |
| Example 12 | Polycarbonate | 10 × 10 | Containing silica | 8 × 8 | 1 | 1 | Direct forming |
| Comparative Example 1 | Polycarbonate | 10 × 10 | Silica-free | 10 × 10 | 1 | 0 | Direct forming |
| Comparative Example 2 | Polycarbonate | 8 × 8 | Silica-free | 8 × 8 | 1 | 0 | Direct forming |

| | Optical semiconductor device Molding embodiment | Potting | Concave die (mm) | Appearance Resin leakage |
|---|---|---|---|---|
| Example 1 | a | Not Conducted | 8 × 8 | Not Observed |
| Example 2 | b | Not Conducted | 8 × 8 | Not Observed |
| Example 3 | c | Not Conducted | 8 × 8 | Not Observed |
| Example 4 | d | Not Conducted | 8 × 8 | Not Observed |
| Example 5 | e | Not Conducted | 20 × 31 | Not Observed |
| Example 6 | f | Not Conducted | 20 × 31 | Not Observed |
| Example 7 | a | Not Conducted | 8φ | Not Observed |
| Example 8 | a | Not Conducted | 8 × 8 | Not Observed |
| Example 9 | a | Not Conducted | 8 × 8 | Not Observed |
| Example 10 | a | Conducted | 8 × 8 | Not Observed |
| Example 11 | a | Not Conducted | 8 × 8 | Not Observed |
| Example 12 | a | Conducted | 8 × 8 | Not Observed |
| Comparative Example 1 | a | Not Conducted | 8 × 8 | Observed |
| Comparative Example 2 | a | Not Conducted | 8 × 8 | Observed |

*: The protrusion ratio of phosphor-containing layer means a value obtained by dividing the shortest protruded length (mm) of the phosphor-containing layer by the thickness (mm) of the encapsulating resin layer on the laminated surface between the phosphor-containing layer and the encapsulating resin layer.

As a result, it is noted that all of the optical semiconductor devices of the Examples are free from the resin leakage and exhibit a favorable appearance. On the other hand, in Comparative Example 1, a defective appearance was caused because of the occurrence of resin leakage. Also, in Comparative Example 2, since the phosphor-containing layer is not present on the side surface of the package, the direct light from the LED chip leaks from the side surface, thereby causing uneven light emission.

While the invention has been described in detail with reference to specific embodiments thereof, it will be apparent to one skilled in the art that various changes and modifications can be made therein without departing from the spirit and scope thereof.

Incidentally, the present application is based on Japanese Patent Application No. 2010-129817 filed on Jun. 7, 2010, and the contents are incorporated herein by reference.

All references cited herein are incorporated by reference herein in their entirety. Also, all the references cited herein are incorporated as a whole.

The encapsulating sheet for an optical semiconductor according to the invention is suitably used for encapsulation of optical semiconductor devices, for example, general illuminators using LED as a light emitting source, backlights of display and high-power applications such as automobile headlights.

DESCRIPTION OF REFERENCE NUMERALS AND SIGNS

1: Concave die
2: Phosphor-containing layer
3: Encapsulating resin layer
4: Optical semiconductor element (LED chip)
5: Resin leaked outside the package
6: Separator
7: Screen
8: Spatula
9: Separator for preparing an encapsulating resin layer molded article
10: Substrate

What is claimed is:

1. An encapsulating sheet for an optical semiconductor, comprising: a phosphor-containing layer containing a phosphor; and an encapsulating resin layer containing an encapsulating resin and being laminated on the phosphor-containing layer, wherein, on the laminated surface therebetween, an edge of the phosphor-containing layer protrudes from an edge of the encapsulating resin layer, and a protruded length of the phosphor-containing layer is from 1 to 10 times a thickness of the encapsulating resin layer.

2. The encapsulating sheet for an optical semiconductor according to claim 1, wherein the encapsulating sheet comprises a plurality of the encapsulating resin layers being laminated on plural places of the phosphor-containing layer at prescribed intervals, and wherein a length between the adjacent encapsulating resin layers is from 2 to 10 times the thickness of the encapsulating resin layer.

3. The encapsulating sheet for an optical semiconductor according to claim 1, wherein a separator is further laminated on a surface of the phosphor-containing layer opposite to the encapsulating resin layer-laminated surface thereof.

4. An optical semiconductor device obtained by disposing an encapsulating sheet for an optical semiconductor so that an encapsulating resin layer is opposite to an optical semiconductor element, followed by press molding using a concave die which has a concave structure having the same shape as in the encapsulating resin layer, wherein the encapsulating sheet for the optical semiconductor comprises: a phosphor-containing layer containing a phosphor; and the encapsulating resin layer containing an encapsulating resin and being laminated on the phosphor-containing layer, wherein, on the laminated surface therebetween, an edge of the phosphor-containing layer protrudes from an edge of the encapsulating resin layer, and a protruded length of the phosphor-containing layer is from 1 to 10 times a thickness of the encapsulating resin layer.

5. The encapsulating sheet for an optical semiconductor according to claim 2, wherein a separator is further laminated on a surface of the phosphor-containing layer opposite to the encapsulating resin layer-laminated surface thereof.

6. The optical semiconductor device according to claim 4, wherein the encapsulating sheet comprises a plurality of the encapsulating resin layers being laminated on plural places of the phosphor-containing layer at prescribed intervals, and wherein a length between the adjacent encapsulating resin layers is from 2 to 10 times the thickness of the encapsulating resin layer.

* * * * *